United States Patent
Rim et al.

(10) Patent No.: US 10,014,425 B2
(45) Date of Patent: Jul. 3, 2018

(54) SPACER FORMATION IN A SOLAR CELL USING OXYGEN ION IMPLANTATION

(71) Applicant: SunPower Corporation, San Jose, CA (US)

(72) Inventors: Seung Rim, Palo Alto, CA (US); David D. Smith, Campbell, CA (US)

(73) Assignee: SunPower Corporation, San Jose, CA (US)

( * ) Notice: Subject to any disclaimer, the term of this patent is extended or adjusted under 35 U.S.C. 154(b) by 781 days.

(21) Appl. No.: 13/631,457

(22) Filed: Sep. 28, 2012

(65) Prior Publication Data
US 2014/0090701 A1    Apr. 3, 2014

(51) Int. Cl.
| H01L 31/0352 | (2006.01) |
| H01L 31/0224 | (2006.01) |
| H01L 31/0236 | (2006.01) |
| H01L 31/068 | (2012.01) |
| H01L 31/18 | (2006.01) |

(52) U.S. Cl.
CPC ........ *H01L 31/035272* (2013.01); *H01L 31/02363* (2013.01); *H01L 31/022441* (2013.01); *H01L 31/0682* (2013.01); *H01L 31/1804* (2013.01); *Y02E 10/52* (2013.01); *Y02E 10/547* (2013.01); *Y02P 70/521* (2015.11)

(58) Field of Classification Search
CPC ....... H01L 31/035272; H01L 31/02241; H01L 31/02363; H01L 31/0682; H01L 31/1804; Y02P 70/521; Y02P 10/547; Y02P 10/52
USPC .................. 136/242–265; 438/57, 63, 87, 97
See application file for complete search history.

(56) References Cited

U.S. PATENT DOCUMENTS

| 2004/0261840 | A1 | 12/2004 | Schmit |
| 2009/0308438 | A1* | 12/2009 | De Ceuster et al. ......... 136/255 |
| 2010/0136768 | A1 | 6/2010 | Biro et al. |
| 2010/0139761 | A1 | 6/2010 | Smith |
| 2010/0212730 | A1 | 8/2010 | Sankin |

(Continued)

FOREIGN PATENT DOCUMENTS

WO    WO 2011145731 A1 * 11/2011

OTHER PUBLICATIONS

PCT International Search Report and Written Opinion of the International Searching Authority for Application No. PCT/US2012/070587, Feb. 20, 2013, 7 sheets.

(Continued)

*Primary Examiner* — Magali P Slawski
*Assistant Examiner* — Kourtney R S Carlson
(74) *Attorney, Agent, or Firm* — Okamoto & Benedicto LLP

(57) ABSTRACT

A solar cell is disclosed. The solar cell has a front side facing the sun during normal operation, and a back side facing away from the sun. The solar cell comprises a silicon substrate, a first polysilicon layer with a region of doped polysilicon on the back side of the substrate. The solar cell also comprises a second polysilicon layer with a second region of doped polysilicon on the back side of the silicon substrate. The second polysilicon layer at least partially covers the region of doped polysilicon. The solar cell also comprises a resistive region disposed in the first polysilicon layer. The resistive region extends from an edge of the second region of doped polysilicon. The resistive region can be formed by ion implantation of oxygen into the first polysilicon layer.

7 Claims, 16 Drawing Sheets

(56) References Cited

U.S. PATENT DOCUMENTS

2013/0048067 A1* 2/2013 Kim et al. .................... 136/256
2013/0061926 A1* 3/2013 Komoda et al. ............. 136/261

OTHER PUBLICATIONS

D. Venables, et al. "Low-dislocation-density silicon-on-insulator material produced by sequential oxygen implantation and low-temperature annealing", Jun. 22, 1992, pp. 3147-3149, Appl. Phys. Lett. vol. 60, No. 25.

* cited by examiner

SPACER FORMATION IN A SOLAR CELL USING OXYGEN ION IMPLANTATION

TECHNICAL FIELD

Embodiments of the subject matter described herein relate generally to solar cells, and more particularly but not exclusively to solar cell structures.

BACKGROUND

Solar cells are well-known devices for converting solar radiation to electrical energy. They may be fabricated on a semiconductor wafer using semiconductor processing technology. Generally speaking, a solar cell may be fabricated by forming n-type and p-type diffusion regions in a silicon substrate. Solar radiation impinging on the solar cell creates electron-hole pairs that migrate to the diffusion regions, thereby creating voltage differentials between the diffusion regions. In a back-contact solar cell, both the diffusion regions and the metal grids coupled to them are on the back side of the solar cell. The metal grids allow an external electrical circuit to be coupled to and be powered by the solar cell.

Efficiency is an important characteristic of a solar cell as it is directly related to the solar cell's capability to generate power. Accordingly, techniques for increasing the efficiency of solar cells are generally desirable. Embodiments of the present invention will be recognized by those skilled in the art as improved back-contact cell structures that allow for advantages in both efficiency and manufacturing cost compared to conventional solar cells.

BRIEF SUMMARY

In one embodiment, a solar cell has a base and emitter diffusion regions formed on the back side. The emitter diffusion region is configured to collect minority charge carriers in the solar cell, while the base diffusion region is configured to collect majority charge carriers. The base diffusion region may be a continuous region separating the emitter diffusion regions. Each of the emitter diffusion regions may be further separated from the continuous base diffusion region by a spacer region extending from the edge of the emitter diffusion regions. This spacer region may be a highly resistive region which reduces space charge recombination losses at the junction of base and emitter diffusion regions thereby increasing solar cell efficiency.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
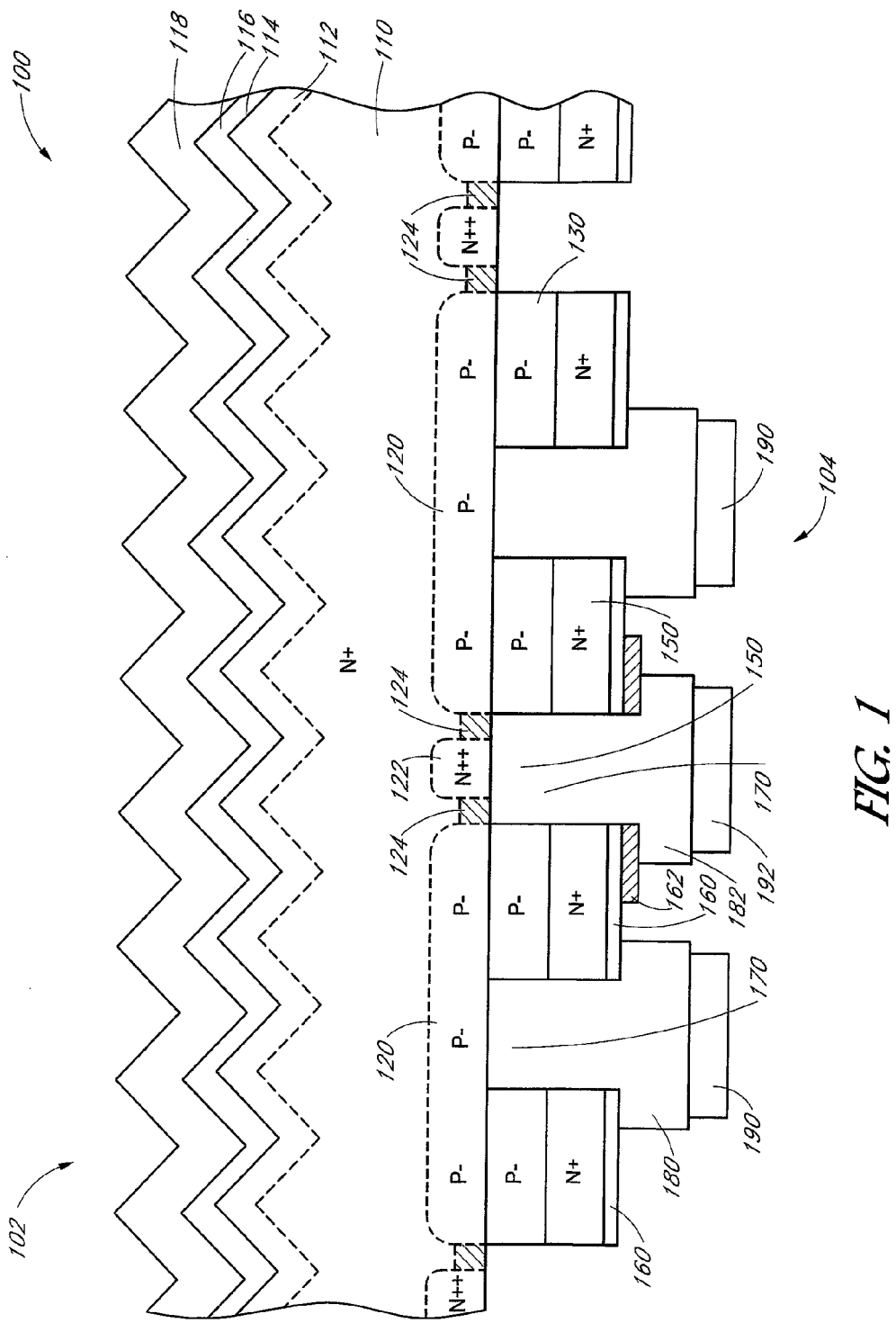
FIGS. 1-9 show a process for creating a back-contact solar cell having a silicon wafer with oxygen-implanted regions, in accordance with a first embodiment of the present invention.

The following detailed description is merely illustrative in nature and is not intended to limit the embodiments of the subject matter or the application and uses of such embodiments. Numerous specific details are provided, such as examples of structures and fabrication steps, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention. The discussion will call upon features shown in the figures which are not drawn to scale. Certain features will be exaggerated to illustrate broader concepts and are not representative of proportions with respect to other features.

"Coupled"—The following description refers to elements or features being "coupled" together. As used herein, unless expressly stated otherwise, "coupled" means that one element/node/feature is directly or indirectly joined to (or directly or indirectly communicates with) another element/node/feature, and not necessarily mechanically. Electrical connection or electrical conduction is one type of coupling between elements or features described herein. Thus, although the schematics shown in the figures depict exemplary arrangements of elements, additional intervening elements, devices, features, or components may be present in an embodiment of the depicted subject matter.

"Adjust"—Some elements, components, and/or features are described as being adjustable or adjusted. As used herein, unless expressly stated otherwise, "adjust" means to position, modify, alter, or dispose an element or component or portion thereof as suitable to the circumstance and embodiment. In certain cases, the element or component, or portion thereof, can remain in an unchanged position, state, and/or condition as a result of adjustment, if appropriate or desirable for the embodiment under the circumstances. In some cases, the element or component can be altered, changed, or modified to a new position, state, and/or condition as a result of adjustment, if appropriate or desired.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

A solar cell is disclosed. The solar cell has a front side facing the sun during normal operation, and a back side facing away from the sun. The solar cell comprises a silicon substrate, a first polysilicon layer with a region of doped polysilicon on the back side of the substrate. The solar cell also comprises a second polysilicon layer with a second region of doped polysilicon on the back side of the silicon substrate. The second polysilicon layer at least partially covers the region of doped polysilicon. The solar cell also comprises a resistive region disposed in the first polysilicon layer. The resistive region extends from an edge of the second region of doped polysilicon. The resistive region can be formed by ion implantation of oxygen into the first polysilicon layer.

Another embodiment of a solar cell is disclosed. The solar cell can have a front side facing the sun during normal operation, and a back side facing away from the sun. The solar cell can comprise a silicon substrate having a front side and a back side, a first doped polysilicon region formed on the back side of the silicon substrate, a second doped polysilicon region formed on the back side of the silicon substrate, wherein the first and second doped polysilicon regions are of opposite polarity, a first dielectric layer formed on the back side of the silicon substrate and underneath each of the first and second doped polysilicon regions, a resistive region between the first and second doped polysilicon regions, the resistive region comprising an oxygen concentration of a specified amount, a first metal grid disposed over the second doped polysilicon region, the first metal grid electrically connected to at least the second doped polysilicon region, a second dielectric layer between the first metal grid and the second doped polysilicon region, the first metal grid being electrically connected to the second doped polysilicon region through at least one contact hole through the second dielectric layer, and a second metal grid electrically connected to the first doped polysilicon region, wherein the first and second metal grids are formed on the back side of the solar cell.

Another embodiment of a solar cell is disclosed. The solar cell has a front side facing the sun during normal operation, and a back side facing away from the sun. The solar cell comprises a silicon substrate having a front side and a back side, a first doped polysilicon region formed on the back side of the silicon substrate, a second doped polysilicon region formed on the back side of the silicon substrate, wherein the first and second doped polysilicon regions are of opposite polarity, and a resistive region extending at least partially between the first and second doped polysilicon regions, the resistive region comprising an oxygen concentration of at least a specified amount.

A cross-section of a back-contact solar cell 100 is shown in FIG. 1. The illustrated structures throughout this document are for descriptive purposes only and not to scale. The solar cell 100 is formed on a silicon substrate 110 having a textured front surface 114, p- and n-type diffusion regions 120, 122 separated by resistive spacer regions 124, and metal grids 190, 192 electrically connected to the p- and n-type diffusion regions 120, 122. The solar cell 100 is designed to face toward the sun with the front side 102 during normal operation. The back side 104 is oriented away from the sun. The solar cell 100 produces a potential difference between the p- and n-type diffusion regions 120, 122, causing a current to flow in the connected metal grids 190, 192. The resistive spacer regions 124 prevent charge recombination in the silicon substrate 110 between the p- and n-type diffusion regions 120, 122.

On the front side 102 of the solar cell 100, an antireflective coating (ARC) 118 is disposed over a protective layer of an oxide 116. The ARC 118 can be composed of a dielectric material such as silicon nitride. A front side diffusion region 112 can be formed underneath the textured surface 114 of the silicon substrate 110. The front side diffusion region 112 improves the quality of the passivation of the front side 102 and can improve the conversion efficiency of the solar cell 100.

The silicon substrate 110 can comprise an n-type or a p-type silicon substrate. A monocrystalline n-type silicon substrate is used for descriptive purposes, although the silicon substrate 110 can be p-type monocrystalline, amorphous silicon, polycrystalline silicon, conductive polymer, thin-film silicon formed by any number of processes including epitaxial growth, or any other substrate as desired, and is used throughout this description. The polarity of the dopants and diffusion regions 120, 122 can be changed when a p-type substrate is used. The silicon substrate 110 can be any desired thickness, from 25 micrometers (microns) to 200 microns, or more.

Figure 2:
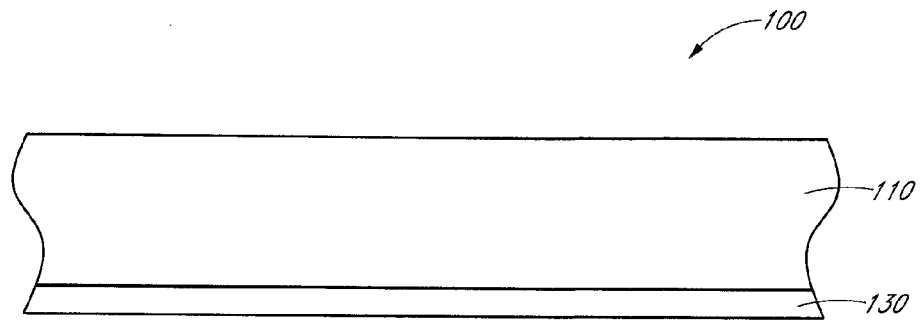

As shown in FIG. 2, the silicon substrate 110 is the starting material for the illustrated process of creating solar cell 100. The silicon substrate 110 can be formed as a sliced wafer from an n-type single-crystal silicon ingot. A damage etch process step can be performed on the silicon substrate 110 prior to formation of the solar cell 100. The damage etch process step can improve the bulk recombination rate of the completed device. The bulk recombination rate (BRR) refers to collapse of electron-hole pairs within the silicon substrate 110, reducing the potential difference created at the p- and n-type diffusion regions 120, 122 of the solar cell 100. The damage etch process step can be a wet etch process which removes contaminants from the surfaces of the silicon substrate 110.

In the process illustrated in FIG. 2, a borosilicate glass (BSG) layer 130 is formed on the back side of the silicon substrate 110. As the illustrated solar cell 100 is an embodiment of a back contact solar cell, the processing steps described occur on the back side 104 of the silicon substrate 110. The BSG layer 130 can be formed by deposition, such as a chemical vapor deposition (CVD). When reference is made to a CVD process throughout this description, and not just for the embodiment shown in FIGS. 1-9, but for any embodiment described herein, it should be understood that any desired CVD technique can be used for deposition, including atmospheric pressure CVD (APCVD), plasma-enhanced CVD (PECVD), ultra-low vacuum CVD (ULVCVD), laser-enhanced CVD (LECVD) or any other variant of CVD. In some embodiments of CVD, the BSG layer 130 can be formed of doped oxide as a product of a vapor-phase reactants diborane, silane, and oxygen. In addition to CVD techniques, other formation methods related to industrial printing, such as spin coating, screen printing, ink jet printing, sputtering, or aerosol jet deposition also can be used to form the BSG layer, or any other formed layer described below.

In the illustrated embodiment, the BSG layer 130 is a p-type doped oxide. An undoped oxide layer can be subsequently formed atop the BSG layer 130 as a product of vapor-phase reactants silane and oxygen. The undoped oxide layer, or capping layer, inhibits diffusion of dopants from the BSG layer 130 out to surrounding structures and exposed regions of the silicon substrate 110 during subsequent thermal steps. The BSG layer 130 and the overlaying undoped oxide layer can be formed sequentially in the same process tool. Additionally, similar capping layers can be formed over other formed dopant source regions throughout the processes described herein. All such capping layers are omitted for clarity of depiction.

The BSG layer 130 can be formed of a substantially uniform thickness approximately 40 nm, although the thickness can vary between embodiments from as thin as a process tool is capable of forming to as thick as desired. Boron is used as a dopant throughout this description for forming p-type diffusion regions. In some embodiments, such as those where the p-type doped silicon regions are formed by direct write or nanoparticle processes, other p-type dopants can be used, or non-BSG boron can be used. Similarly, although PSG is described for use in forming n-type doped silicon, other dopants besides phosphorous can be used as well.

Figure 3:
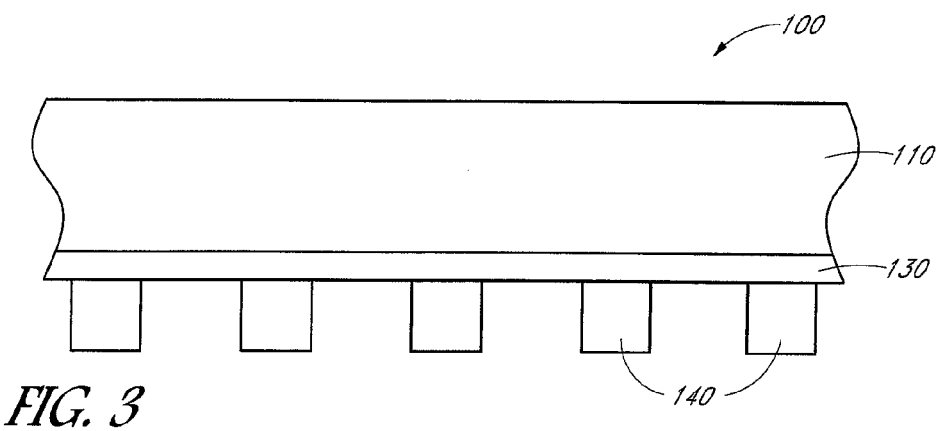

FIG. 3 illustrates the subsequent step of fabrication of solar cell 100, wherein a patterning mask layer 140 is formed over the BSG layer 130. The mask layer 140 can comprise an alkaline resist material such as polymers and dielectrics as well as any combination thereof, although any other desired material can be used. The mask layer 140 can be formed by screen printing, ink jet printing, or any industrial printing technique. A screen printed mask layer, such as mask layer 140, can be patterned with openings for future depositions on the BSG layer 130. The pattern of the mask layer 140 can vary between embodiments. In one embodiment the mask layer 140 can have a pattern of dotted holes to enable future dotted base diffusion regions in an emitter field formed from dopants in the BSG layer 130 and may include, for example, the techniques described in commonly-assigned U.S. Pat. No. 8,008,575, which is incorporated herein by reference in its entirety.

Figure 4:
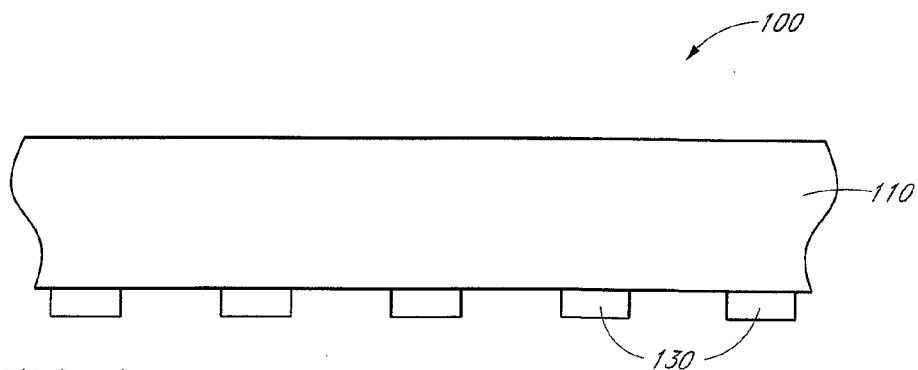

With respect to FIG. 4, the substrate has been etched as patterned by the mask layer 140 to remove portions of the BSG layer 130. The etchant can be selected so as to not etch the remainder of the silicon substrate 110. One etchants that can be used is potassium hydroxide in mixture with isopropyl alcohol (IPA), although other wet or dry etchants can be used if desired. In some embodiments, the BSG layer 130 can be formed in the pattern created by the etch in FIG. 4, removing the need for a mask and etch step. For example the patterned BSG layer 130 could be formed by screen printing or ink jet printing. In other embodiments, the whole BSG layer 130 of FIG. 2 can be patterned without etching such as by laser ablation.

Figure 5:
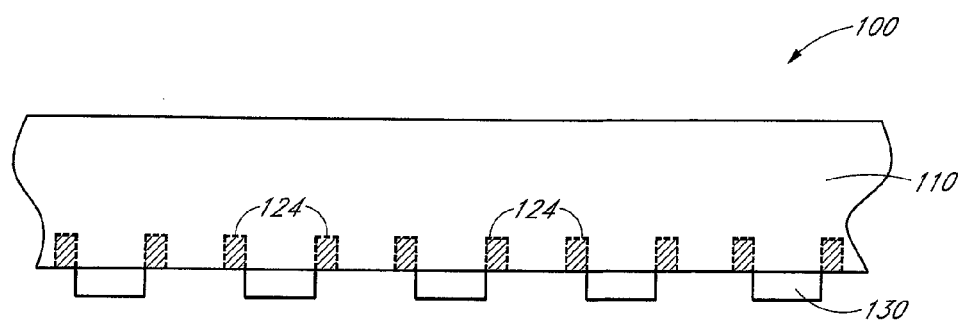

Referring to FIG. 5, because the solar cell 100 functions when a potential difference is created between n- and p-type diffusion regions, it is advantageous to enhance the potential difference between the diffusion regions. One technique for enhancing the potential difference is to increase the resistance in the silicon substrate 110 between the diffusion regions. Another technique is to alter the microstructure of the silicon substrate between the diffusion regions. For example, regions of the silicon crystal lattice can be disrupted by processing techniques such as ion implantation or laser annealing. Yet another technique, illustrated in FIG. 5, is to alter the composition of the silicon substrate between the diffusion regions. For example, ion implantation of oxygen species in the silicon substrate can be used to create resistive spacer regions 124 comprising silicon dioxide between the diffusion regions in the silicon substrate 110. In some embodiments, the resistive spacer regions 124 can have a resistivity of at least $1.0 \times 10^{-4}$ Ohm cm.

The resistive spacer regions 124 can be aligned with respect to patterned BSG regions 130. Alignment techniques between the spacer regions 124 and the patterned BSG regions 130 can include visual inspection or automated measurement techniques to tolerances as desired. The resistive spacer regions 124 can be deposited in specific patterns by masking techniques to enable ion implantation in select regions of the silicon substrate. In one embodiment, the resistive spacer regions are deposited as rings extending outwards from each as-patterned circular BSG region. Masking techniques can include forming layers of materials on the silicon substrate, and can be made from silicon, polymeric materials such as photoresist, dielectric materials such as silicon dioxide, silicon nitride, silicon carbide, metal and metal silicide materials such as titanium or tungsten silicide, or combinations thereof. Generally, masks made from more dense materials are more effective at preventing ion implantation in undesired regions. The mask material and mask thickness can be selected to form the desired ion-implanted profile. Shadow masking is another technique to enable ion implantation in select regions of the silicon substrate. In one embodiment, shadow masking utilizes a mask positioned above the silicon substrate with apertures formed to allow ions to pass into the substrate in select regions as desired. In another embodiment, oxygen ions are implanted in select regions of the silicon substrate with an energy of 50-500 keV, a dose of $1 \times 10^{16}$ to $9 \times 10^{17}$ cm$^{-2}$, a beam-current density of 1 µa to 1 mA/cm$^2$, and a process temperature of 300-900° C.

Figure 6:
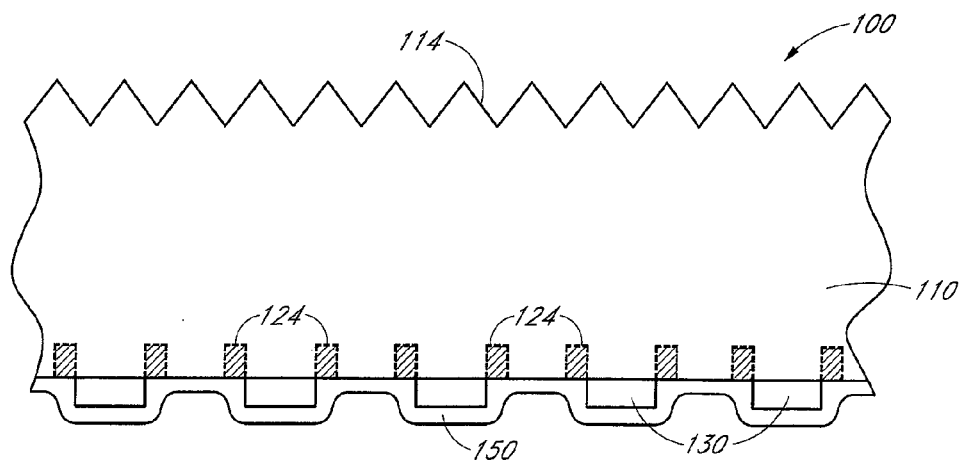

In the process step illustrated in FIG. 6, a phosphosilicate glass (PSG) layer 150 is formed over the back side 104 of the solar cell 100. The PSG layer 150 can be formed by chemical vapor deposition or any of the techniques discussed above in the formation of the BSG layer 130. In the illustrated embodiment, the PSG layer 150 is an n-type doped oxide. An undoped oxide capping layer can be subsequently formed atop the PSG layer 150, although the capping layer is omitted for purposes of illustrative clarity. The PSG layer 150 can be formed of a substantially uniform thickness approximately 40 nm, although the thickness can vary between embodiments from as thin as a process tool is capable of forming to as thick as desired. In the illustrated embodiment, the PSG layer 150 is formed as a substantially conformal layer covering the patterned BSG regions 130 and the exposed regions of the back side 104 of the silicon substrate 110.

The solar cell 100 can be subjected to a random texturization etch process to create light-scattering and light-trapping structures from the silicon substrate 110 on the front surface 114, as shown in FIG. 6. In the illustrated embodiment, the resulting front surface 114 can be patterned with pyramid-shaped structural features. The pyramid-shaped structures can improve conversion efficiency of the solar cell 100 by increasing refraction and reflection of impinging light at the front surface 114. Etchants used in the random texturization etch process can include potassium hydroxide, isopropyl alcohol, a mixture thereof, or other wet or dry etchants as desired. The etch process can occur on any regions of the silicon substrate 110 exposed to the etchant. In some embodiments, a patterning mask layer comprising an alkaline resist material can be deposited to protect select regions, or all, of the back side 104. Such an alkaline resist material can comprise a polymeric material such as photoresist or a dielectric material such as silicon dioxide. In the embodiment illustrated in FIG. 6, the etchant is selected such that the PSG layer 150 protects the back side 104 of the solar cell 100 from the random texturization etch process.

Figure 7:
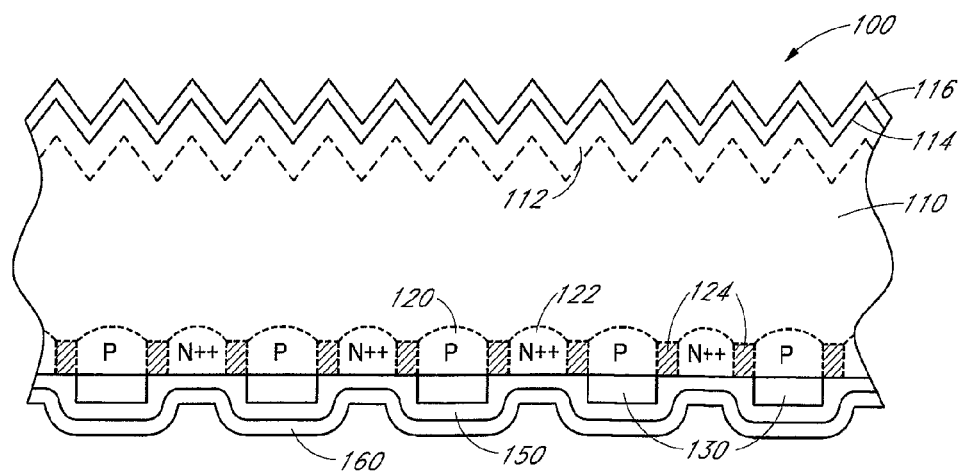

Referring to FIG. 7, a heating process is performed on the solar cell 100 to form p- and n-diffusion regions 120, 122 separated by the resistive spacer regions 124. The heating process allows dopant species to diffuse from n- and p-dopant source regions, specifically, the BSG and PSGE layers 130, 150 into the silicon substrate 110. At higher temperatures, such as at or near 1000° C., the diffusion regions become electrically active. The temperature of the thermal process can be varied based on the embodiment of solar cell being processed. For example, it can be longer or shorter in duration, or at lower or higher temperatures, so long as sufficient dopant concentration is present in the p- and n-diffusion regions 120, 122 upon completion. Thus, different dopant sources than BSG or PSG can result in changes to the thermal processing step. Regardless, the parameters of the thermal process can produce electrically active doped regions in the substrate, enabling the functional solar cell.

The heating process can take place in a furnace with single temperature operation, multiple temperature setpoints, or programmable operation with options for multiple temperature setpoints and introduction of process gases. The heating of the solar cell can take place in an inert environment such as a vacuum or nitrogen gas or a reactant environment such as oxygen gas or phosphoryl chloride gas, or any mixture therein as desired. In some embodiments, the heating step can also utilize multiple temperature setpoints to anneal the silicon substrate, thereby altering the resistivity, prior to creating diffusion regions in the solar cell.

In addition to the heating step and its function described with reference to FIG. 7, there can be additional heating processes or steps included in the processing of the solar cell 100. For example, in some embodiments, annealing of the ion-implanted resistive spacer regions 124 can occur immediately following the implantation or formation steps. The annealing heating step can also occur at other points during the cell fabrication process, such as, in some embodiments, after a single dopant source is formed and before the opposite polarity dopant source is present. The exact number of, parameters for, and process order for heating steps can vary between embodiments and is true for any heating step described herein.

In other embodiments, the heating step can utilize a programmable temperature operation in conjunction with oxygen gas be used to form protective layers of oxide over the solar cell. In some embodiments, the thermal process can be combined with one or more additional process steps, such as the diffusion of a dopant layer. For example, if the front texturization process step is omitted or reserved until after the thermal step, the formation of the PSG layer 150 can be combined with a dopant diffusion step, resulting in formation of the PSG layer 150 simultaneous with diffusion from the BSG and PSG layers 130, 150. In the illustrated embodiment, the solar cell 100 is subjected to a heating process comprising multiple temperature setpoints and multiple process gases including oxygen and phosphoryl chloride to allow for annealing of the ion-implanted resistive spacer regions 124 comprising silicon dioxide, the formation of the p- and n-diffusion regions 120, 122 in the silicon substrate 110, a front side diffusion region 112, and a protective layer of oxide 116.

With continued reference to FIG. 7, a back antireflection coating (bARC) layer 160 comprising a dielectric material is formed on the back side 104 of the solar cell 100. The bARC layer 160 is formed over the PSG layer 150. In the illustrated embodiment, the bARC layer 160 is comprised of silicon nitride with a thickness of about 40 nm, deposited by PECVD. The bARC layer 160 can have a relatively large positive fixed charge density to provide good surface passivation, and can occur as part of the PECVD process. Other dielectric materials besides silicon nitride can be used to form the bARC layer 160. Additionally, when silicon nitride or another material is used to form the bARC layer 160, the thickness can be varied from as little as 1 nm to as thick as desired for the embodiment.

Figure 8:
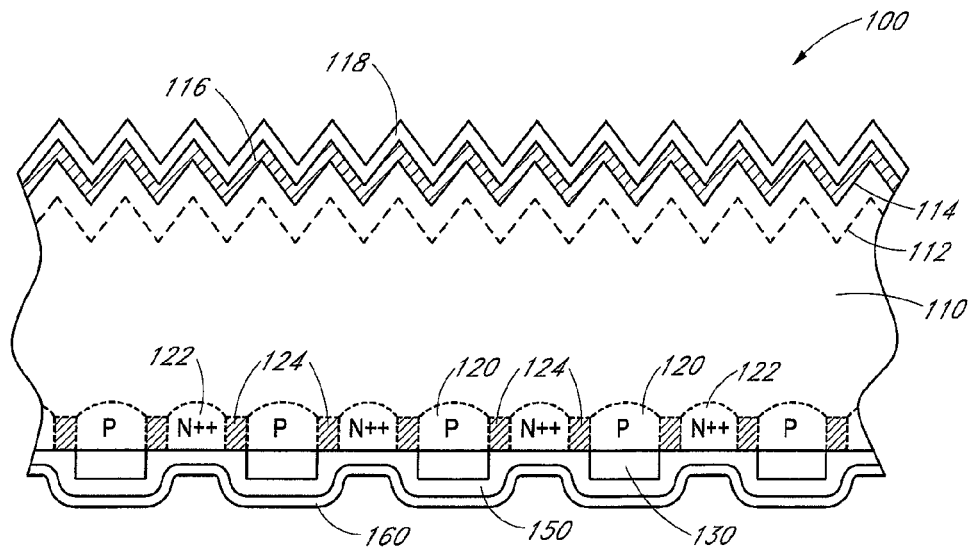

A similar antireflection coating (ARC) layer 118 can be formed on the textured front side 102 of the solar cell 100, as illustrated in FIG. 8. The ARC layer 118 can be comprised of silicon nitride with a thickness of about 50 nm, deposited by PECVD. As with the bARC layer 160, the thickness and material used for the ARC layer 118 can vary between embodiments.

Figure 9:
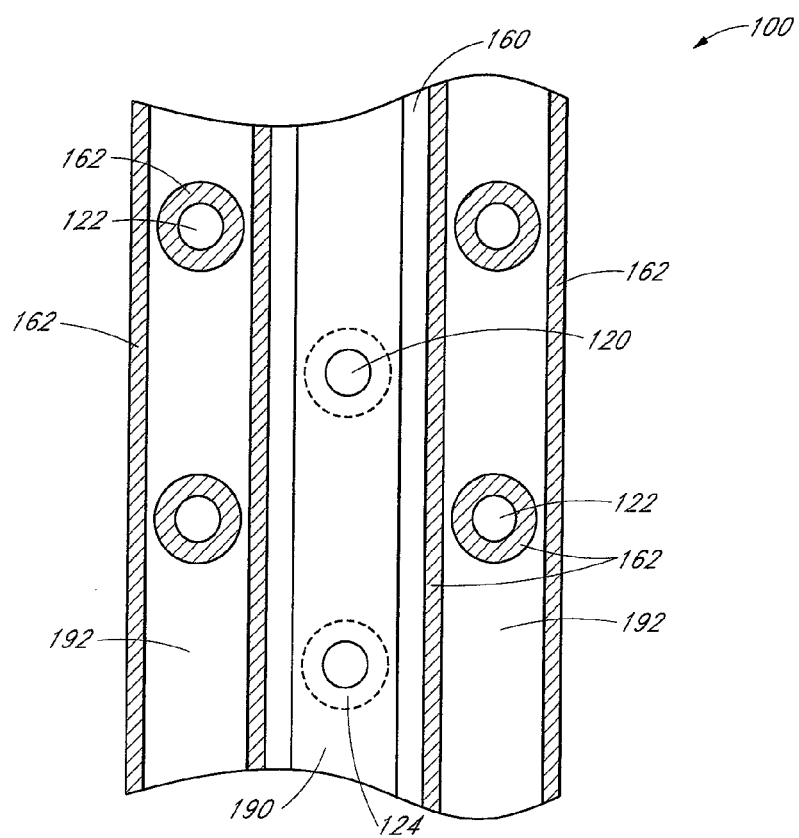

A top view of the back side 104 of the solar cell 100 is depicted in FIG. 9. As can be seen, although the p- and n-diffusion regions 120, 122 can be formed wherein the n-diffusion regions 122 are discrete regions within, separated by, and surrounded by the larger p-diffusion region 120.

In some embodiments, including the illustrated embodiment, a dielectric layer 162 is formed over the BSG, PSG, and bARC layers 130, 150, 160 in linear rows covering the n-diffusion regions 122 of the solar cell 100. The rows of dielectric layer 162 are illustrated beneath the n-type metal grid 192 in FIG. 9. The dielectric layer 162 may comprise a polymeric insulating material such as polyimide and may be deposited by industrial print methods such as screen printing and ink jet printing, or any other formation technique. The dielectric layer 162 can extend over portions of the p-diffusion regions 120. The dielectric layer 162 can be formed of a material selected to provide electrical insulation between the soon to be formed n-type metal grid 192 and the p-diffusion regions 120.

With continued reference to FIG. 9 and reference again to FIG. 1, contact holes can be formed through the layers on the back side 104 of the solar cell 100 to expose portions of the underlying p- and n-diffusion regions 120, 122 in the silicon substrate 110. The contact holes are the openings in the BSG, PSG, and bARC layers 130, 150, 160 in which the contact plugs 170, 172 are located. The contact holes through these layers can be formed by diverse techniques, such as mask and etch processes described above or laser ablation techniques, including the techniques described, for example, in commonly-assigned U.S. Pat. Nos. 8,211,731 and 8,263,899, which are incorporated herein by reference in their entirety.

After the contact holes have been opened to the p- and n-diffusion regions 120, 122 in the silicon substrate 100, a metallization process can be performed to create contact plugs 170, 172 which provide electrical connection to the p- and n-diffusion regions 120, 122, respectively. In one embodiment, the contact plugs 170, 172 can include seed layers 180, 182 of aluminum silicon alloy, titanium-tungsten alloy, and copper, which is sequentially sputtered with each material having a substantially uniform thickness of about 30 nm, although the thicknesses can vary between embodiments, and other materials, such as silver, gold, nickel, or other electrical conductors can be used. The aluminum silicon alloy layer of the seed layers 180, 182 is in contact with the respective p- and n-diffusion regions 120, 122, and the copper layer is uppermost, with the titanium-tungsten layer between them.

The deposition processes may include sputtering or other physical vapor deposition techniques. Accordingly, some or all of the material which is used to form the contact plugs 170, 172 can be distributed over the rest of the back side 104 of the solar cell 100. Some of the distributed aluminum layer can be formed immediately over the bARC layer 160, which can increase the conversion efficiency of the solar cell 100. The aluminum layer enhances internal reflection of light on the back side 104 of the solar cell 100 by redirecting light which has passed through the silicon substrate 110 back in to it, as described in, for example, commonly-assigned U.S. Pat. Nos. 7,388,147 and 7,339,110, which are incorporated herein by reference in their entirety.

Industrial printing techniques such as screen printing, ink jet, or aerosol may also be used to deposit components of the metal seed layer for improved manufacturing cost. The metal seed layers 180, 182 are then plated to form p- and n-type interdigitated metal fingers 190 192, respectively. The plating material forming the p- and n-type interdigitated metal fingers 190, 192 can be copper, silver, gold, aluminum, or any other desired electrical conduct. The plating process can be electrolytic or electroless, as desired.

In certain embodiments, the seed layers 180, 182 are omitted entirely, and contact is made directly to the p- and n-diffusion regions 120, 122. In other embodiments, the seed layers 180, 182 can be formed by printed metal paste, with additional contact layer formations prior to metal finger formation if used in the specific embodiment.

Figure 10:
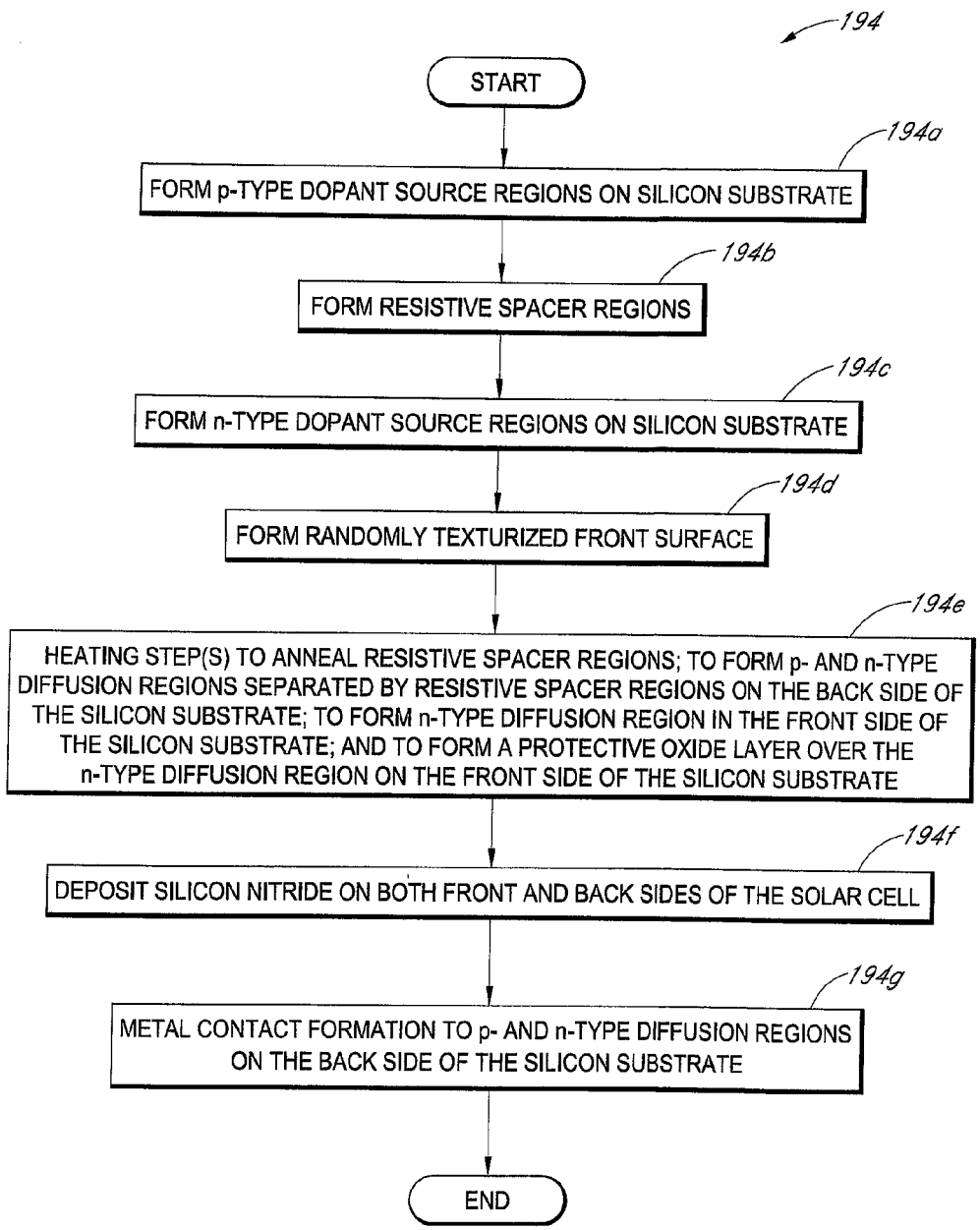
FIG. 10 is a flowchart illustrating a process for creating a back-contact solar cell with a silicon substrate having oxygen-implanted regions.

Referring to FIG. 10, a flow diagram of a method 194 of fabricating a solar cell is shown in accordance with the embodiment of the presented in FIGS. 1-9. In the method 194, doped regions are formed in the back surface of the crystalline silicon substrate. First dopant source regions can be deposited and patterned over the silicon substrate 194a, followed by formation of resistive spacer regions extending from the sides of the first dopant source regions 194b. Second dopant source regions can then be deposited and patterned over the substrate 194c. The solar cell can then undergo an etchant process to texturize the front surface for increased solar radiation collection 194d. A diffusion step can then drive the first and second dopant species into the silicon substrate, forming the n- and p-type diffusion regions as well as forming a lightly doped region on the front side 194e. A protective silicon oxide layer can be formed over the lightly doped region on the front side 194e. A dielectric layer in the form of silicon nitride also can be formed on both the front and back sides of the solar cell 194f. Interdigitated metal contact fingers may be formed through the dielectric layer to the n- and p-type diffusion regions in the silicon substrate to establish an electrical connection 194g.

FIGS. 11-20 show sectional views illustrating the fabrication of another embodiment of a solar cell 200. In this embodiment, the solar cell 200 is fabricated with polysilicon p- and n-type doped regions on a back side of a silicon substrate. As used throughout, the term polysilicon refers to polycrystalline silicon, in any non-monocrystalline form. A groove or trench separates the p-type doped region from the n-type doped region. At least one resistive spacer region can be formed in the polysilicon layer. The resistive spacer regions can be formed beneath or alongside the trench between the p- and n-type doped regions. Among other advantages, the resulting structure increases efficiency by improving electrical resistance between adjacent doped regions. Improved electrical resistance can inhibit recombination in a space charge region in the polysilicon layer.

Figure 11:
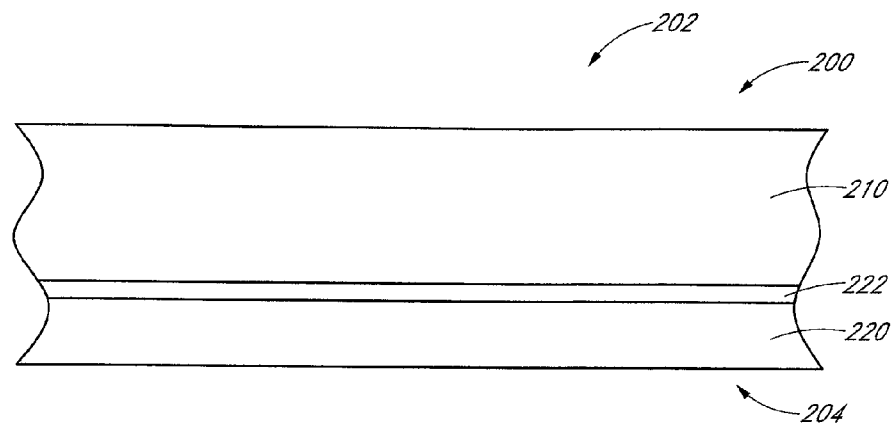
FIGS. 11-20 illustrate another process for creating a back-contact solar cell with a silicon substrate having ion-implanted resistive regions, in accordance with another embodiment of the present invention.

With reference to FIG. 11, a back contact solar cell 200 can be formed with an n-type silicon substrate 210. A dielectric layer 222 can be formed on the back side 204 of the silicon substrate 210 to a thickness of 0.5 nm to 8 nm. In one embodiment, the dielectric layer 222 comprises silicon dioxide thermally grown on the surface of the substrate 210 to a thickness of about 2 nm. A polysilicon layer 220 can be formed over the dielectric layer 222 to a thickness of 100 nm to 400 nm. In one embodiment, the polysilicon layer 220 is thermally grown to a thickness of about 220 nm. The polysilicon layer 220 can be formed through other techniques as well, including printing, whether inkjet or screen printing, and nanoparticle coalescence, among others. Other techniques that may be used are described in commonly-assigned U.S. Pat. No. 7,468,485, which is incorporated herein by reference in its entirety.

Figure 12:
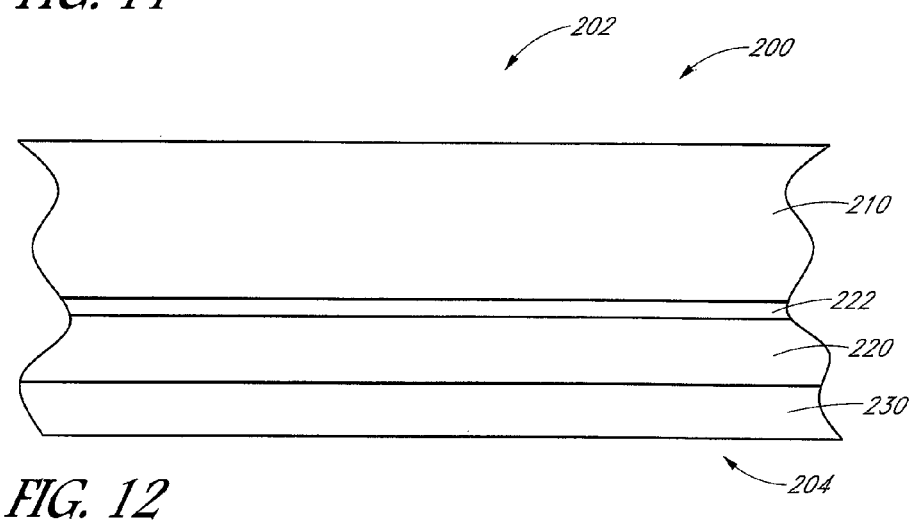

With reference to FIG. 12, a BSG layer 230 can be formed over the polysilicon layer 220. The BSG layer 230 can be formed by any deposition techniques, including the CVD techniques described above. The BSG layer 130 can be formed of a substantially uniform thickness approximately 40 nm, although the thickness can vary between embodiments from as thin as a process tool is capable of forming to as thick as desired.

Figure 13:
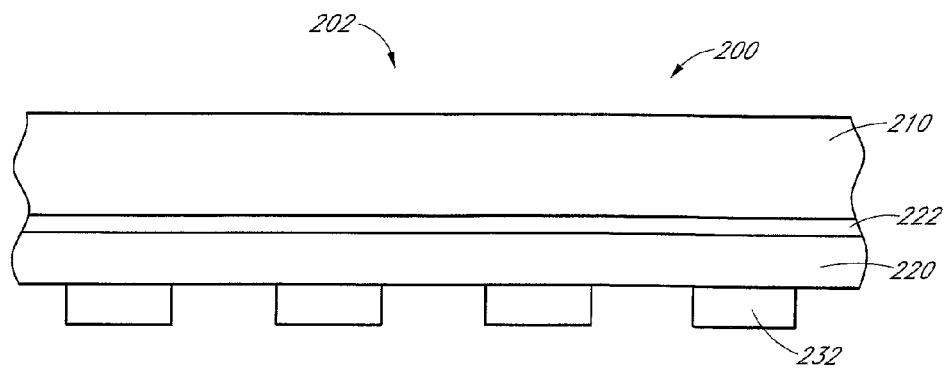

With reference to FIG. 13, a mask and etch technique similar to those described above with reference to the embodiment illustrated in FIGS. 1-9 may be used to pattern the BSG layer 230 to form discrete and separated BSG dopant source regions 232. In some embodiments, the resulting BSG dopant source regions 232 extend in a linear shape along the surface of the polysilicon layer 220.

Figure 14:
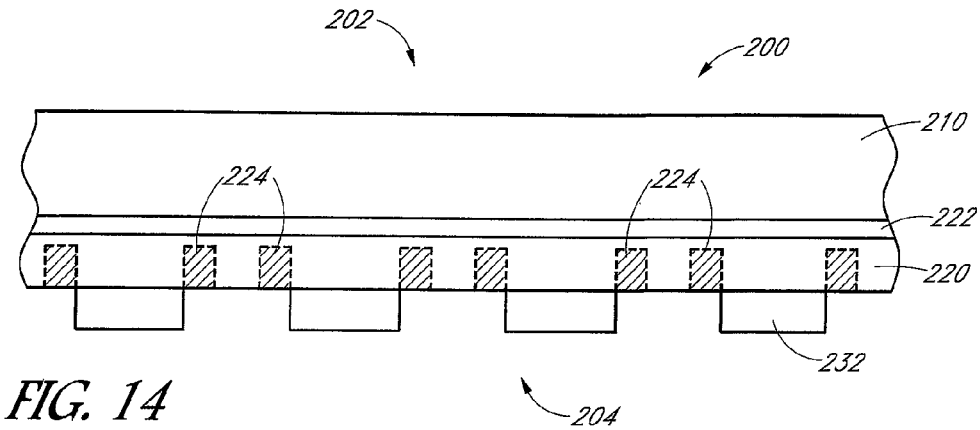

With reference to FIG. 14, resistive spacer regions 224 can be formed in the polysilicon layer 220. In some embodiments, the resistive spacer regions 224 can extend outward in the polysilicon layer 220 from the edges of BSG dopant source regions 232. In some embodiments, the resistive spacer regions 224 can extend deeper toward the silicon substrate 210, extending at least partially through the dielectric layer 222. The resistive spacer regions 224 can be formed by implanting oxygen ions into the solar cell 200 using ion implantation techniques as described above. The formation of, and characteristic features of, the resistive spacer regions 224 can be similar to those described above with respect to FIGS. 1-9, or can be different. Some variations include the processing technique, time, current of implantation, or resulting depth of implantation, sheet resistance properties, or oxygen concentration in the polysilicon layer 220.

Figure 15:
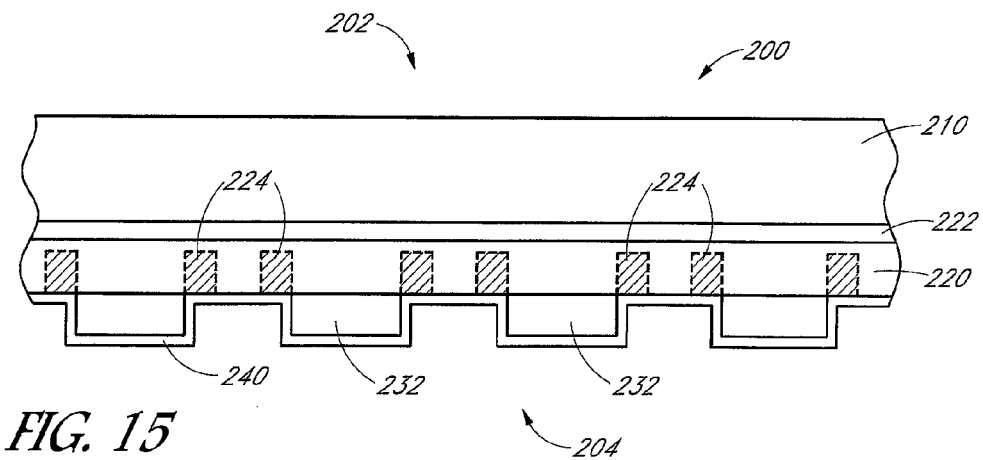

With reference now to FIG. 15, a PSG layer 240 of substantially uniform thickness can be formed by a CVD process over the back side 204 of the solar cell 200. The PSG layer 240 can be conformal and follow the surfaces of the BSG dopant source regions 232, as shown. In some embodiments, the PSG layer 240 can be formed by printing techniques, resulting in a PSG layer 240 which does not overlay the entire back side 204 of the solar cell 200, but is formed in a desired pattern.

Figure 16:
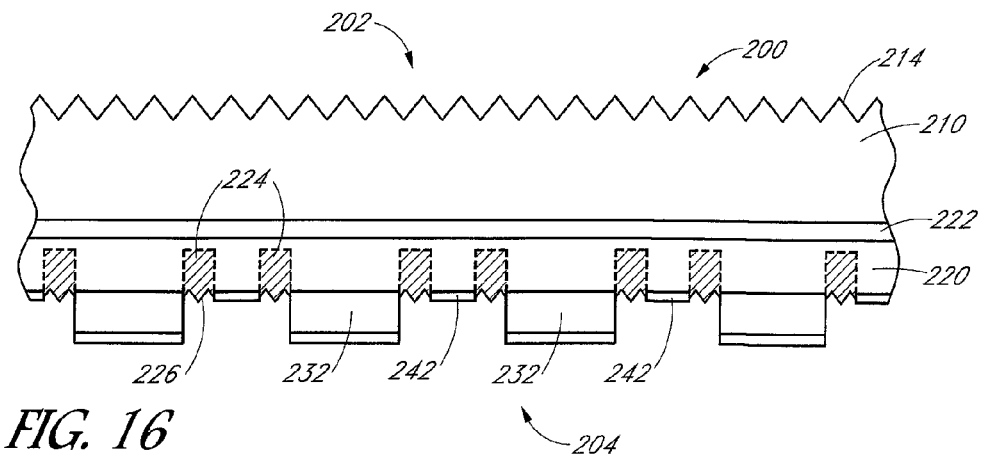

With reference to FIG. 16, a textured trench structure 226 can be formed between BSG dopant source regions 232 and PSG dopant source regions 242. The trench 226 can be formed over the resistive spacer region 224. The trench 226 can be formed by laser ablation or conventional mask and etch techniques and may extend 1 to 10 microns into the silicon substrate 210. In one embodiment, the process of trench 226 formation can include masking and etching the PSG layer 240 to form the illustrated PSG dopant source regions 242. Thus, a patterned mask can be formed over the PSG layer 240 with openings to permit etching of the PSG layer 240 in locations which form trench 226 regions and, in the same etch, pattern the PSG layer 240 to form PSG dopant source regions 242. Each trench 226 can extend between a BSG dopant source region 232 and a PSG dopant source region 242. In some embodiments, each trench 226 extends only partially through each resistive spacer region 224 in the polysilicon layer 220. In some embodiments, portions of the PSG layer 240 can be patterned to remain atop the BSG dopant source regions 232 without inhibiting further processing in the manner described herein. In some embodiments, laser ablation can be used to simultaneously pattern the PSG layer 240 into PSG dopant source regions 242 while creating each trench 226 between the BSG and PSG dopant source regions 232, 242. Other embodiments can include the techniques described in, for example, commonly-assigned U.S. Pat. Nos. 7,812,250 and 7,851,698, which are incorporated herein by reference in their entirety.

In one embodiment, the trench 226 can be formed to extend in to the polysilicon layer 220 and resistive spacer regions 224 to a depth of 1 micron. In one embodiment, the trench 226 is 100 microns wide. In other embodiments, it can be as narrow as 5 microns, or as wide as 1,000 microns.

The trench 226 can be formed using a process that not only forms the trench 226 separating the BSG and PSG dopant source regions 232, 242, but also forms a randomly textured surface on the surface of the trench 226 on the back side 204 of the solar cell 200. In some, but not all embodiments, the texturization process can also provide a randomly textured surface on the front surface 214 of the solar cell 200. As described above, the randomly textured surface 214 improves the conversion efficiency of the solar cell 200.

Figure 17:
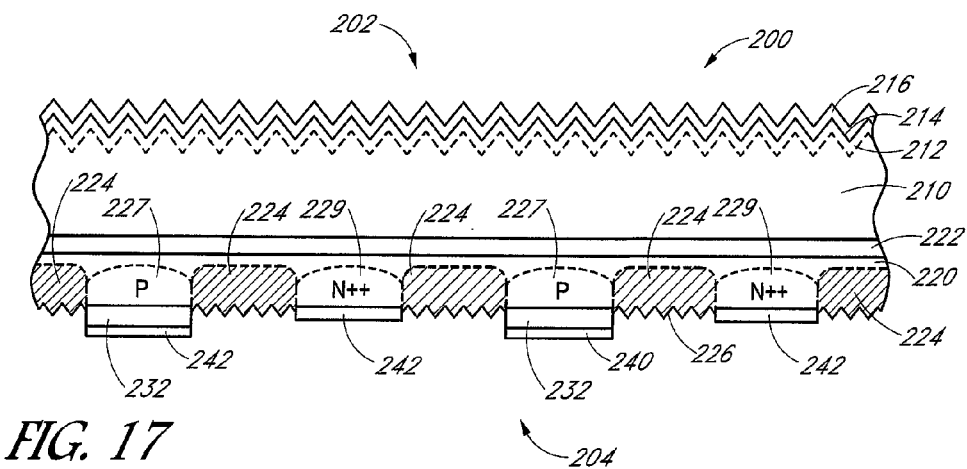

With reference to FIG. 17, a heating step can be performed to form p- and n-diffusion regions 227, 229 in the polysilicon layer 220. The p- and n-diffusion regions 227, 229 can be separated in the polysilicon layer 220 by the trench 226 and also the resisitive spacer regions 224. The heating process can be performed to permit dopant species to diffuse from the BSG and PSG dopant source regions 232, 242 into the polysilicon layer 220. At temperatures near 1000° C., the p- and n-diffusion regions 227, 229 become electrically active. As described above with reference to FIGS. 1-9, numerous different thermal processes can be used to accomplish the heating step. In one embodiment, the solar cell 200 can be subjected to a heating process comprising multiple temperature setpoints and multiple process gases. Some process gases include oxygen and phosphoryl chloride. Oxygen and phosphoryl chloride, as well as other gases, can permit annealing of the ion-implanted resistive spacer regions 224 while the same thermal process can permit or cause the formation of the p- and n-diffusion regions 227, 229, a front side diffusion region 212, and a protective layer of oxide 216.

Figure 18:
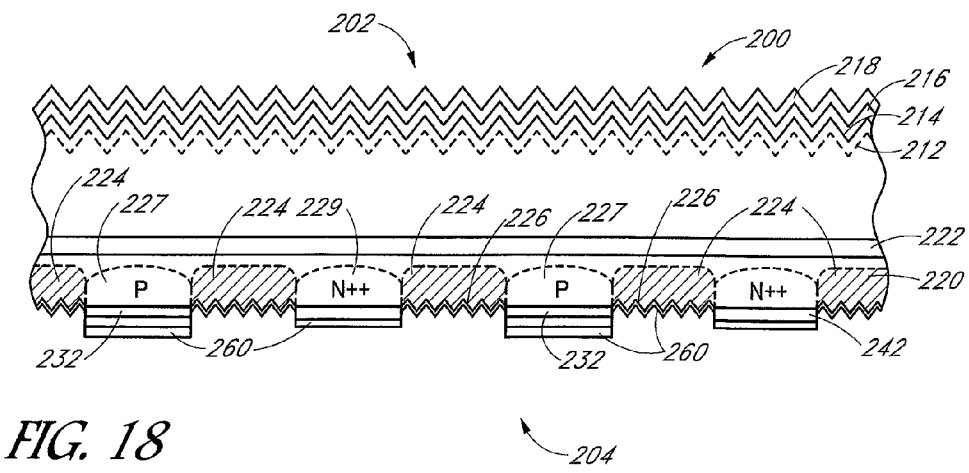

With reference to FIG. 18, a bARC layer 260 comprising a dielectric material can be formed on the back side of the solar cell 200. In some embodiments, the bARC layer 260 is comprised of silicon nitride with a thickness of about 40 nm, deposited by a CVD technique. The bARC layer 260 can be similar to that described above with respect to FIGS. 1-9. In the illustrated embodiment, the bARC layer 260 is also formed over the textured trench regions 226, although in other embodiments, the bARC layer 260 can be patterned during formation to avoid the trenches 260.

An ARC layer 218 also can be formed on the textured front side 202 of the solar cell 200. The ARC layer 218 can be comprised of silicon nitride and the ARC layer 218 can have a thickness of about 50 nm, deposited by a CVD process. In some embodiments, the thickness can be changed to as thin as 10 nm, or as thick as several microns. In other embodiments, the ARC layer 218 can be formed of a material besides silicon nitride, such as oxides of titanium or aluminum, other dielectric materials, polymeric materials, or any combination thereof.

Figure 19:
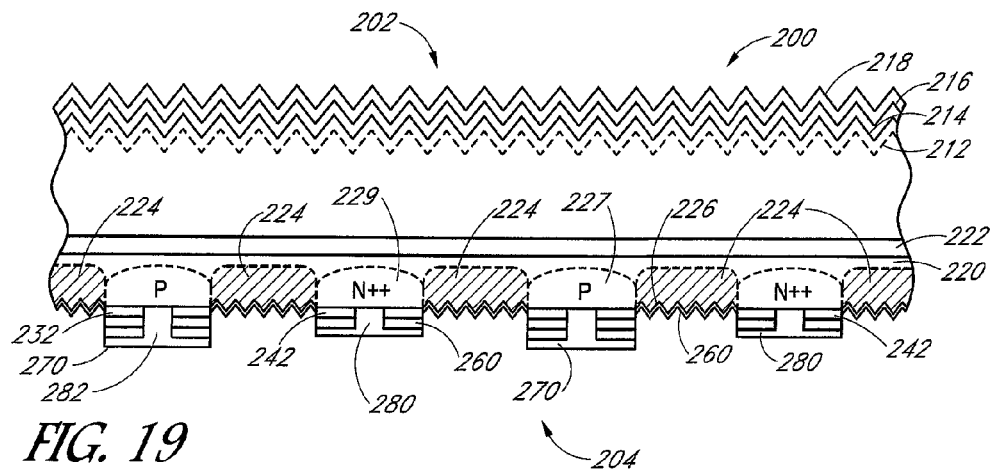
Figure 20:
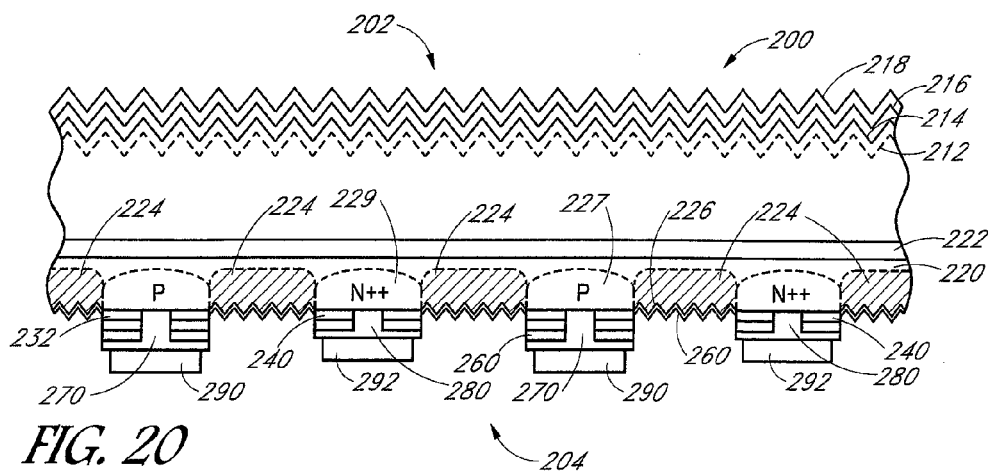

As illustrated in FIG. 19, contact holes can be formed on the back side 204, opening regions of the bARC layer 260, PSG dopant source regions 242, and, in some portions of the solar cell 200, the BSG dopant source regions 232 as well. In some embodiments, the contact holes can be formed by mask and etch techniques, while in others, laser ablation techniques or other techniques can be used. After the contact holes have been opened to expose the p- and n-diffusion regions 227, 229 in the polysilicon layer 220, a metallization process can be performed to provide electrical contact to the diffusion regions. As described above, in some embodiments, a metal seed stack can be formed in the contact holes to create electrical contact plugs 270, 280, which electrically couple to the p- and n-diffusion regions 227, 229, respectively. In some embodiments, the metal contact plugs 270, 280 can comprise a seed layer with aluminum silicon alloy, titanium tungsten alloy, and copper portions. As illustrated in FIG. 20, the seed layer can then be plated with an electrically conductive material to form p- and n-type interdigitated metal fingers 290, 292, respectively. Any contact technique or metallization process or structure can be used, including those described above with reference to FIGS. 1-9.

Figure 21:
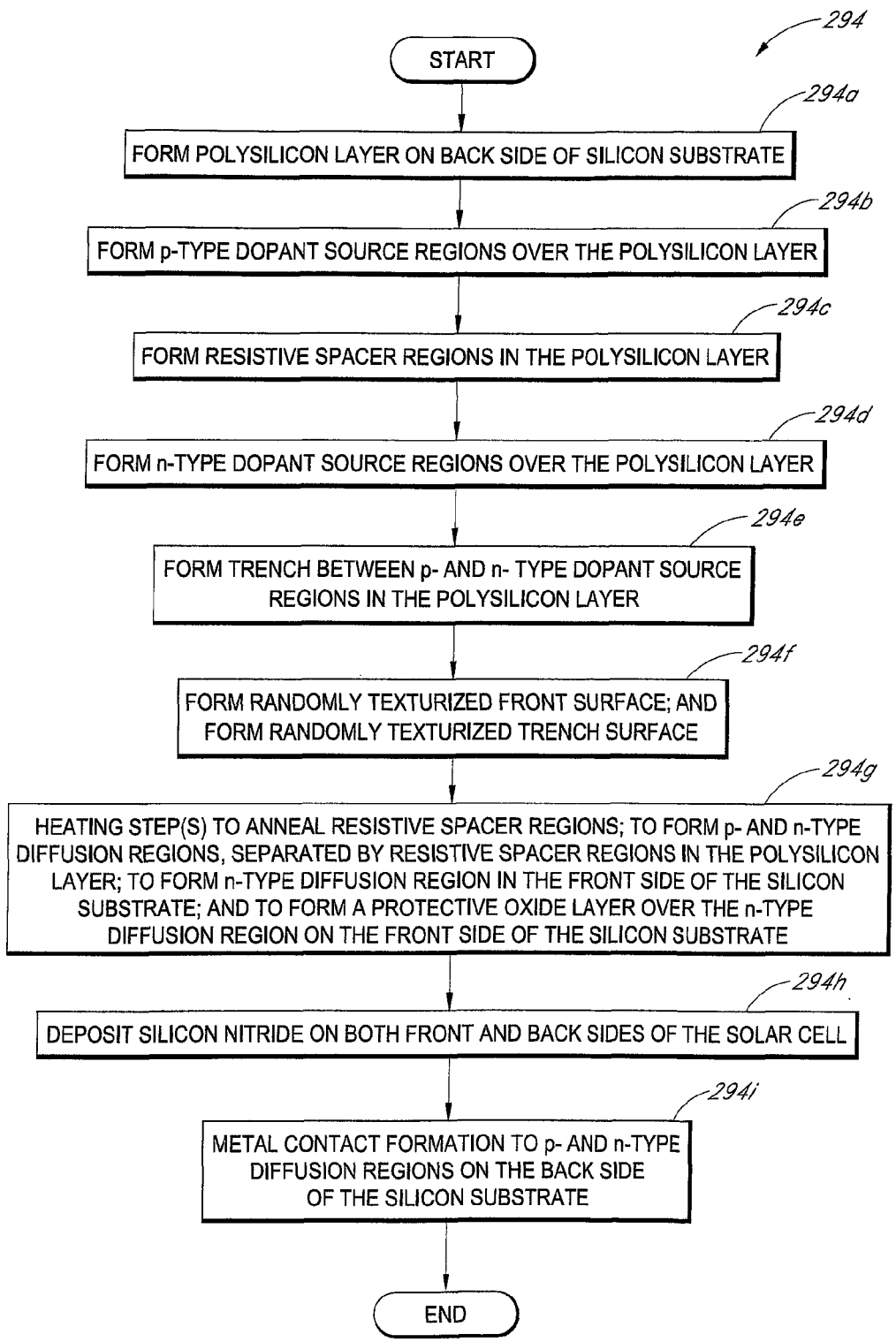
FIG. 21 is a flowchart illustrating a process for creating a back-contact solar cell with a silicon substrate having ion-implanted resistive regions.

Referring to FIG. 21, a flow diagram of a method 294 of fabricating a solar cell is shown in accordance with the embodiment of the presented in FIG. 11-20. In the method 294, a polysilicon layer is formed on the back side of a silicon substrate 294a. First dopant source regions can be deposited and patterned over the polysilicon layer 294b, followed by formation of resistive spacer regions extending from the sides of the first dopant source regions 294c. Second dopant source regions then can be deposited and patterned over the substrate 294d. A trench structure can be created between the first and second dopant source regions 294e. The solar cell can then be processed with an etchant to pattern the front surface for increased solar radiation collection 294f. Similarly, the trench structures are also textured on the back side of the solar cell 294f, although the front and back surfaces can be patterned in different process steps, if desired.

A diffusion step can then be used to drive the first and second dopant species into the polysilicon layer, forming the n- and p-type diffusion regions as well as forming a lightly doped region on the front side 294g. A protective silicon oxide layer can be formed over the lightly doped region on the front side in the same process step, or a discrete earlier or later one 294g. A dielectric layer in the form of silicon nitride can be formed on both the front and back sides of the solar cell 294h. Interdigitated metal contact fingers can be formed through the back surface dielectric layer to the n- and p-type diffusion regions in the silicon substrate to establish an electrical connection 294i.

FIGS. 22-26 show sectional views illustrating the fabrication of another embodiment of a solar cell 300. The solar cell 300 can be fabricated with polysilicon p- and n-type doped regions on a back side of a silicon substrate. In some embodiments, one or both of the p- and n-type dopant sources can be deposited by industrial printing techniques, including screen printing and inkjet printing. In some embodiments, doped oxide layers, such as BSG and PSG can be patterned by conventional mask and etch techniques. In certain embodiments, the p- and n-type dopant sources can include nanoparticles and/or dopant inks. A resistive spacer region can be formed in or beneath a trench structure between the p- and n-type doped regions.

Figure 22:
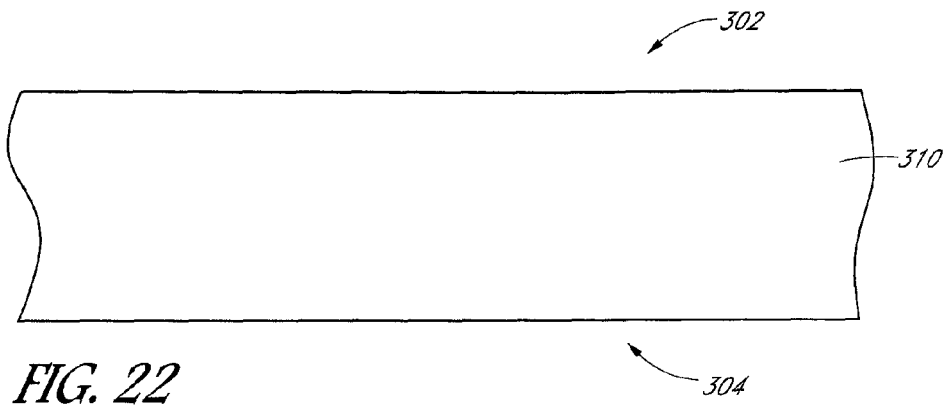
FIGS. 22-27 illustrate another embodiment of a solar cell with resistive spacer regions in a polysilicon layer.
Figure 23:
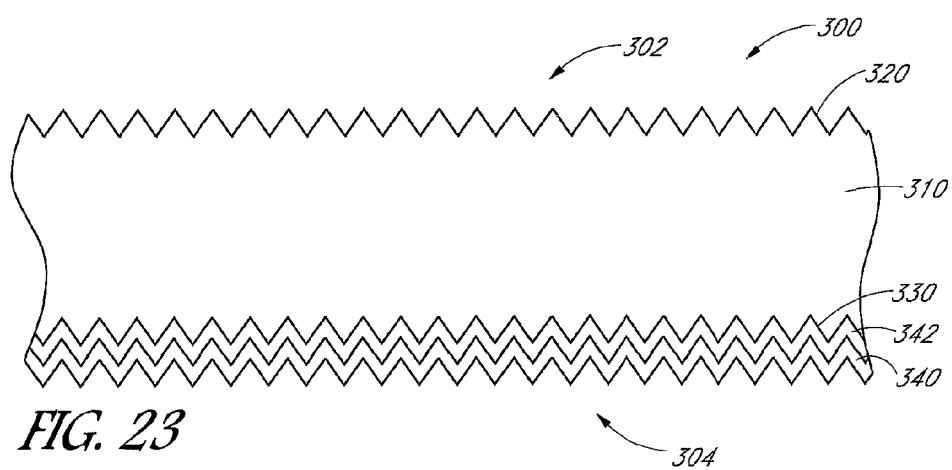

As shown in FIG. 22, a silicon substrate 310 having a front and back side 302, 304 can be used as the starting material for the solar cell 300. With additional reference to FIG. 23, the silicon substrate 310 can undergo an etchant process to create a randomly textured surfaces on the front and back surfaces 320, 330 of the silicon substrate 310.

After forming the textured front and back surfaces 320, 330, a dielectric layer 342 can be formed on the back side 304 of the texturized silicon substrate 310 to a thickness of 0.5 nm to 4 nm. In one embodiment, the dielectric layer 342 can comprise silicon dioxide thermally grown on the surface of the substrate 310 to a thickness of about 2 nm. A polysilicon layer 340 can be formed over the dielectric layer 342. The polysilicon layer 340 can have a thickness of between 50 nm and 800 nm. In one embodiment, the polysilicon layer 340 is thermally grown to a thickness of about 220 nm. In other embodiments, the polysilicon layer 340 can be formed through other techniques or processes.

Figure 24:
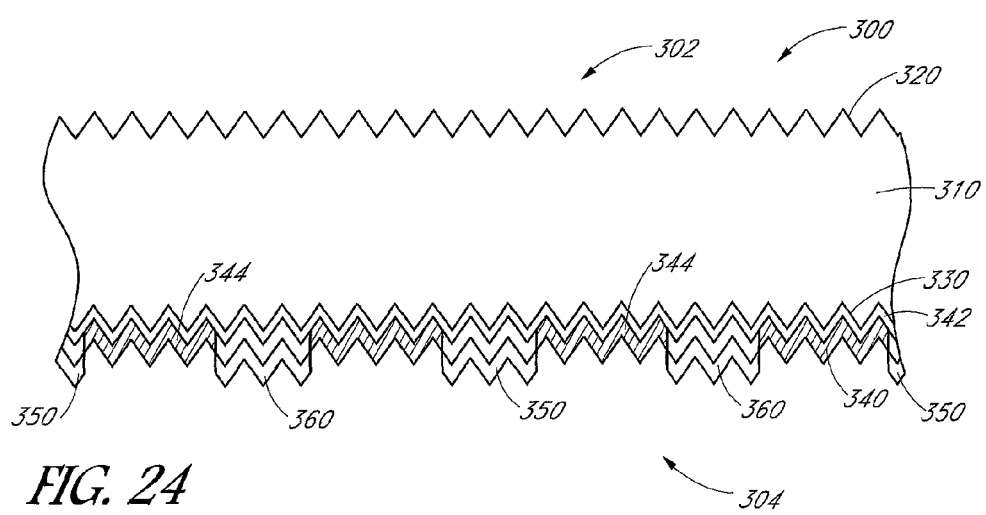

With reference to FIG. 24, resistive spacer regions 344 can be formed in the polysilicon layer 340 using techniques and to parameters desired for the embodiment, as described above. Dopant source regions, specifically, p- and n-type dopant source regions 350, 360 can be formed on the polysilicon layer 340. The dopant source regions 350, 360 can be formed using any of various direct write processes. For example, in some embodiments, one or both of the dopant source regions can be inkjet printed, and, when both are inkjet printed, the printing can be done simultaneously or sequentially.

In some embodiments, the direct write processes can be sequential, such as when a first inkjet process forming one dopant source region, while a subsequent inkjet process forms the second type of dopant source region. Alternatively, a screen print process can form the first dopant source region and a subsequent inkjet process can form the second dopant source regions. In such a combination of processes, the second dopant source regions can be formed in discrete areas of exposed polysilicon layer 240, such as when a patterned print mask is used. Additionally, in some embodiments, the inkjet-printed first dopant source regions can be formed beneath on the polysilicon layer 240, and the second dopant source regions can be formed by screen printing as a uniform layer covering both the first dopant source regions and the exposed regions of the polysilicon layer 340.

Regardless of the specific technique or process order used to form the p- and n-type dopant source regions 350, 360, they can be formed such that the alternating polarities of dopants are separated by the resistive spacer regions 344, as shown in FIG. 24.

Figure 25:
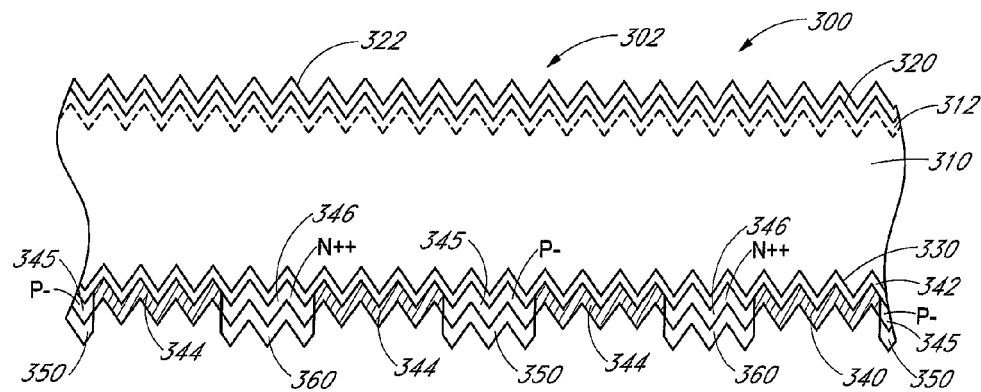

With reference to FIG. 25, a heating step can then be performed to drive dopants from the p- and n-type dopant source regions 350, 360 into the polysilicon layer 340. The dopant drive step forms p- and n-diffusion regions 345, 346 in the polysilicon layer 340. The p- and n-diffusion regions 345, 346 are separated, at least partially, by the resistive spacer regions 344.

Figure 26:
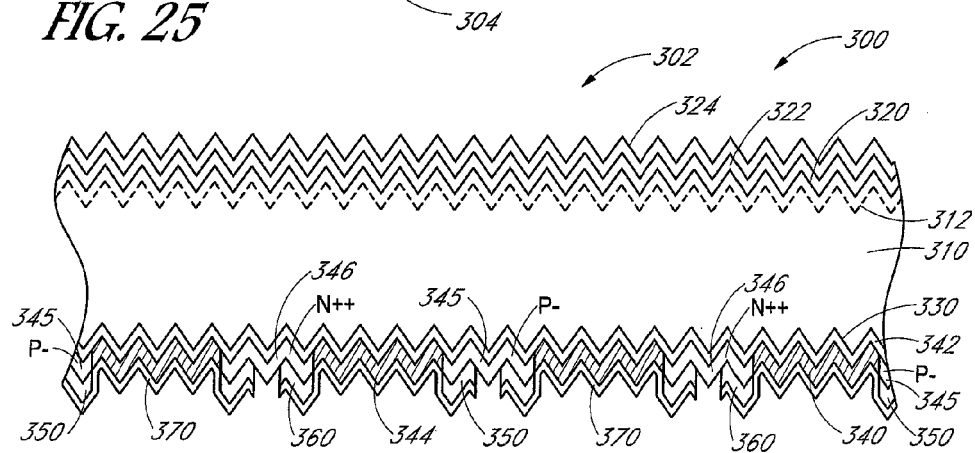
Figure 27:
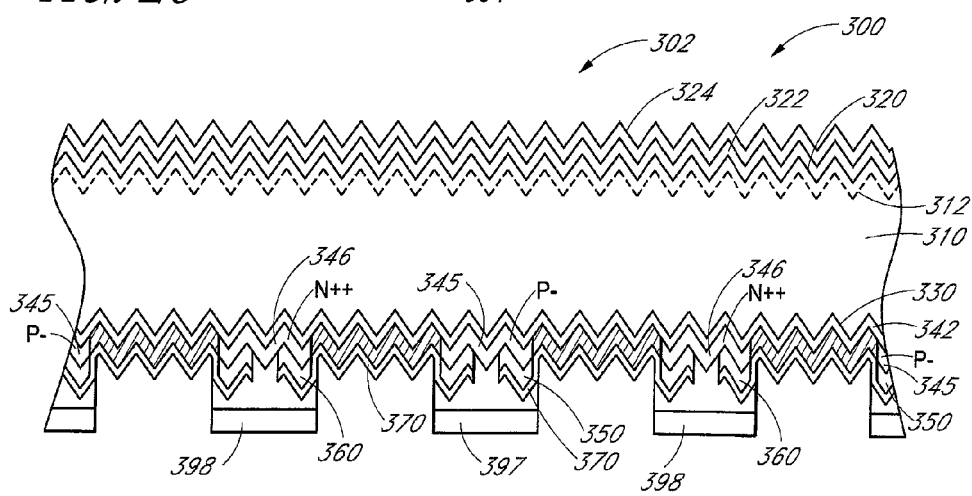

With reference to FIG. 26, ARC and bARC layers 324, 370 can be formed as described above. Contact holes can be formed through the bARC layer 370, exposing the p- and n-diffusion regions 345, 346 in the polysilicon layer 340. With additional reference to FIG. 27, interdigitated metal grids 397, 398 can be formed with an electrical connection to the p- and n-diffusion regions 345, 346, respectively. As with other embodiments described above, a seed layer can also be formed prior to formation of the interdigitated metal grids 397, 398.

Figure 28:
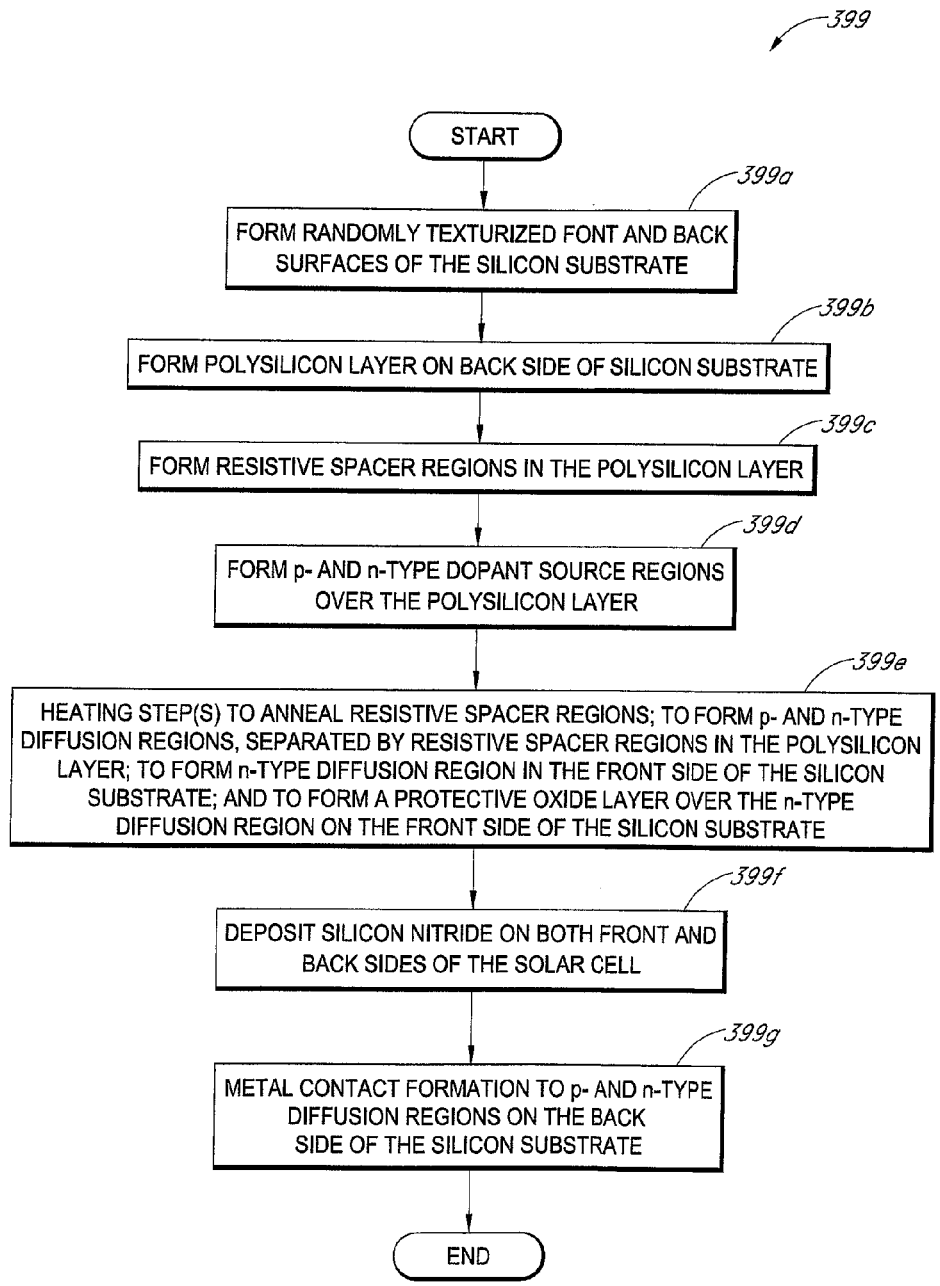
FIG. 28 is a flowchart illustrating a process for creating a solar cell with resistive spacer regions, in accordance with the embodiment shown in FIGS. 22-27.
Figure 29:
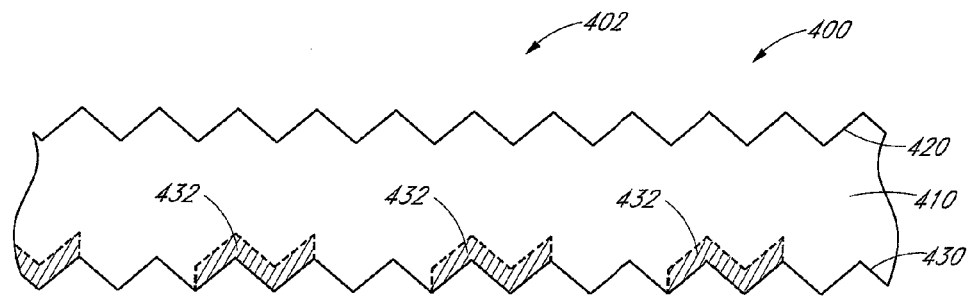
FIGS. 29-33 illustrate another embodiment of a solar cell with resistive spacer regions.

FIG. 28 is a flowchart diagram 399 of a process for fabricating a solar cell in accordance with the embodiments described with respect to FIGS. 22-26. A silicon substrate can first be exposed to an etchant to create texturized front and back surfaces 399a. A polysilicon layer can then be formed on the back side of the silicon substrate 399b. The polysilicon layer and silicon substrate can have a thin dielectric layer, such as a layer of silicon dioxide, formed between them. Resistive spacer regions can then be formed in the polysilicon layer 399c. Dopant source regions of opposite polarity can be formed such that the dopant sources are positioned between the resistive spacer regions 399d. The dopant regions can alternate polarity such that the resistive space regions are positioned between adjacent, opposite polarity dopant sources on the polysilicon layer.

A heating step can then be performed to drive dopants into the polysilicon layer 399e. In some embodiments, this heating step can also anneal the ion-implanted resistive spacer regions, while in other embodiments, an earlier heating step can have already annealed the regions. In some embodiments, the ion-implanted resistive spacer regions can be annealed by laser, omitting the need for a thermal step. ARC and bARC layers can then be formed on the solar cell 399f. The solar cell can then be metalized to form electrical connections to diffusion regions in the polysilicon layer 399g. Metallization can be accomplished by opening contact holes using laser ablation, mask-and-etch techniques, or any other desired approach, with metal contacts formed from an annealed paste, seed layer with plated contacts, etc.

FIGS. 29-33 illustrate another process for fabricating a solar cell 400. With respect to FIG. 29, a silicon substrate 410 can be texturized on both front and back sides 402, 404. Resistive spacer regions 432 can be formed in the silicon substrate 410 by oxygen species implantation, as described above.

Figure 30:
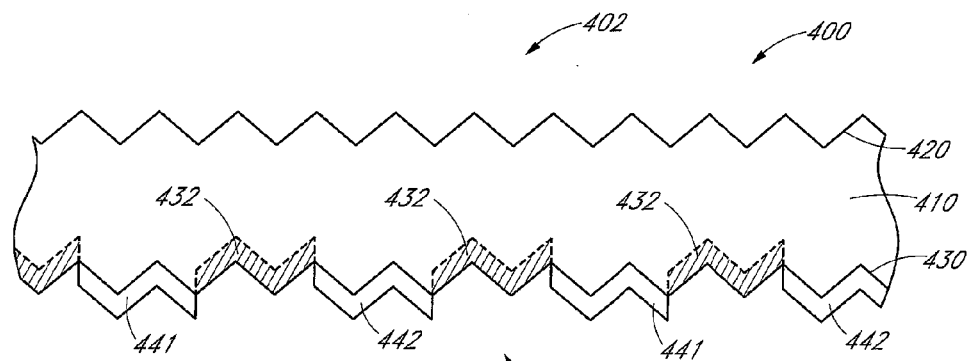

With respect to FIG. 30, direct write processes can be used to form p- and n-type dopant source regions 441, 442 on the back surface 430 of the silicon substrate 410. The p- and n-type dopant source regions 441, 442 can be formed between and surrounded by the resistive spacer regions 432. The p- and n-type dopant source regions 441, 442 can be composed of nanoparticle doped silicon deposited by inkjet or other processing technique.

Figure 31:
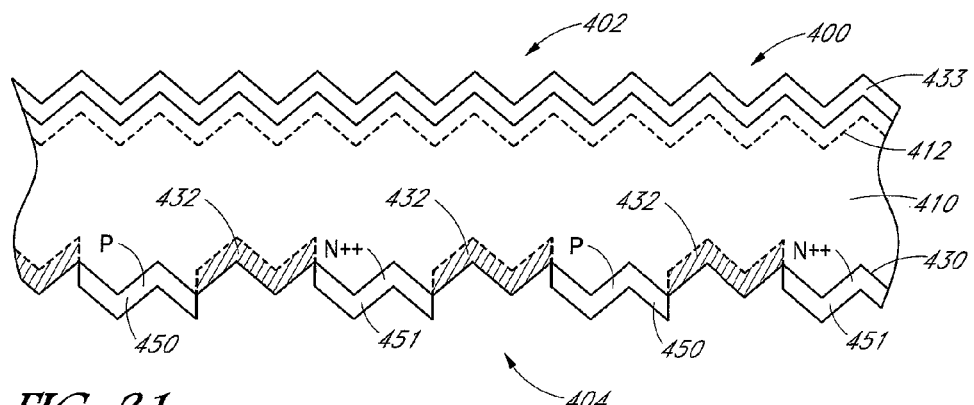

With respect to FIG. 31, one or more heating steps can be performed to anneal the resistive spacer regions 432, form a front diffusion region 412 on the front side 402 of the solar cell 400, and coalesce the dopant source regions 441, 442. In some embodiments, the nanoparticle dopant source regions 441, 442 can be heated to form doped polycrystalline silicon regions. In some embodiments, the nanoparticle dopant source regions 441, 442 can be first coalesced by a heating step to remove binders or solvents, and later annealed to form electrically-active silicon structures. In some embodiments, the thermal steps can be combined to a single heating step with multiple setpoints for temperature, duration, and cooling, including cyclical processing. In some embodiments, a capping layer, such as a layer of amorphous silicon, can be formed above the nanoparticle regions prior to coalescing or annealing.

As a result of the processing of the nanoparticle dopant source regions 441, 442, electrically-active regions of doped polysilicon are present atop the back surface 430 of the silicon substrate 410, as shown in FIG. 31. The p- and n-doped regions 450, 451 are separated by the resistive spacer regions 432 in the silicon substrate 410.

Figure 32:
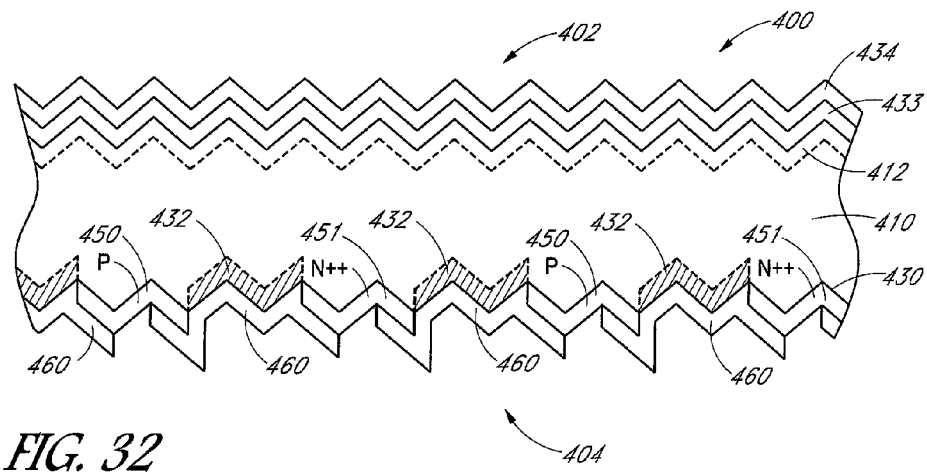
Figure 33:
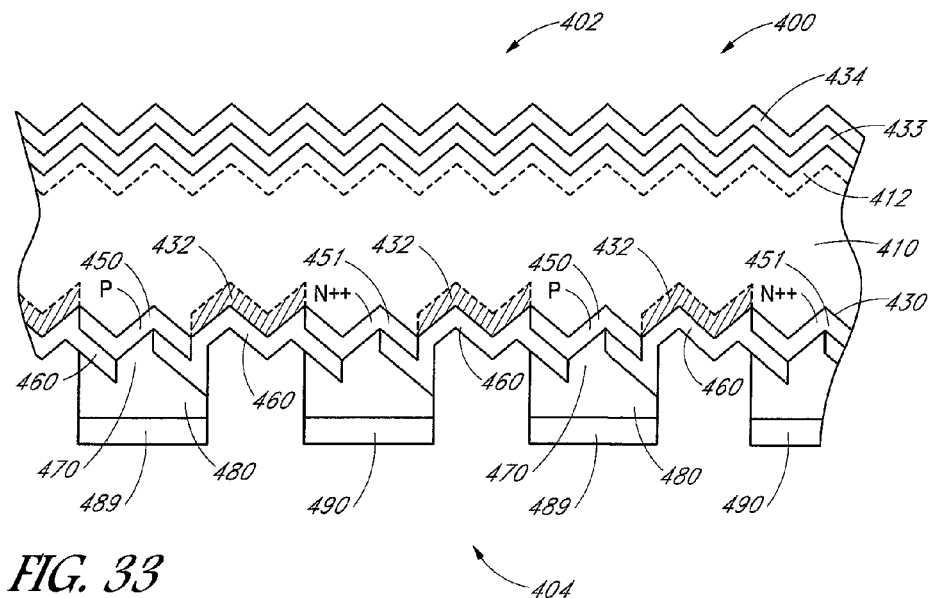

As shown in FIGS. 32 and 33, ARC and bARC layers 434, 460 can be formed, and contact holes opened therethrough. Metal grids 489, 490 can contact the electrically-active p- and n-doped regions 450, 451, respectively, through the contact holes. In some embodiments, an oxide layer 433 can be formed under the ARC layer 434, as described above.

As with all embodiments, the process and materials used for contact formation can vary, such as from seed layers to printed metallization techniques, or from copper grids electrolytically plated to a seed layer to copper plated to a nickel intermediary layer. Contact hole openings to the p- and n-doped regions 450, 451 can be formed using mask-and-etch techniques, laser ablation, or any other desired process.

Figure 34:
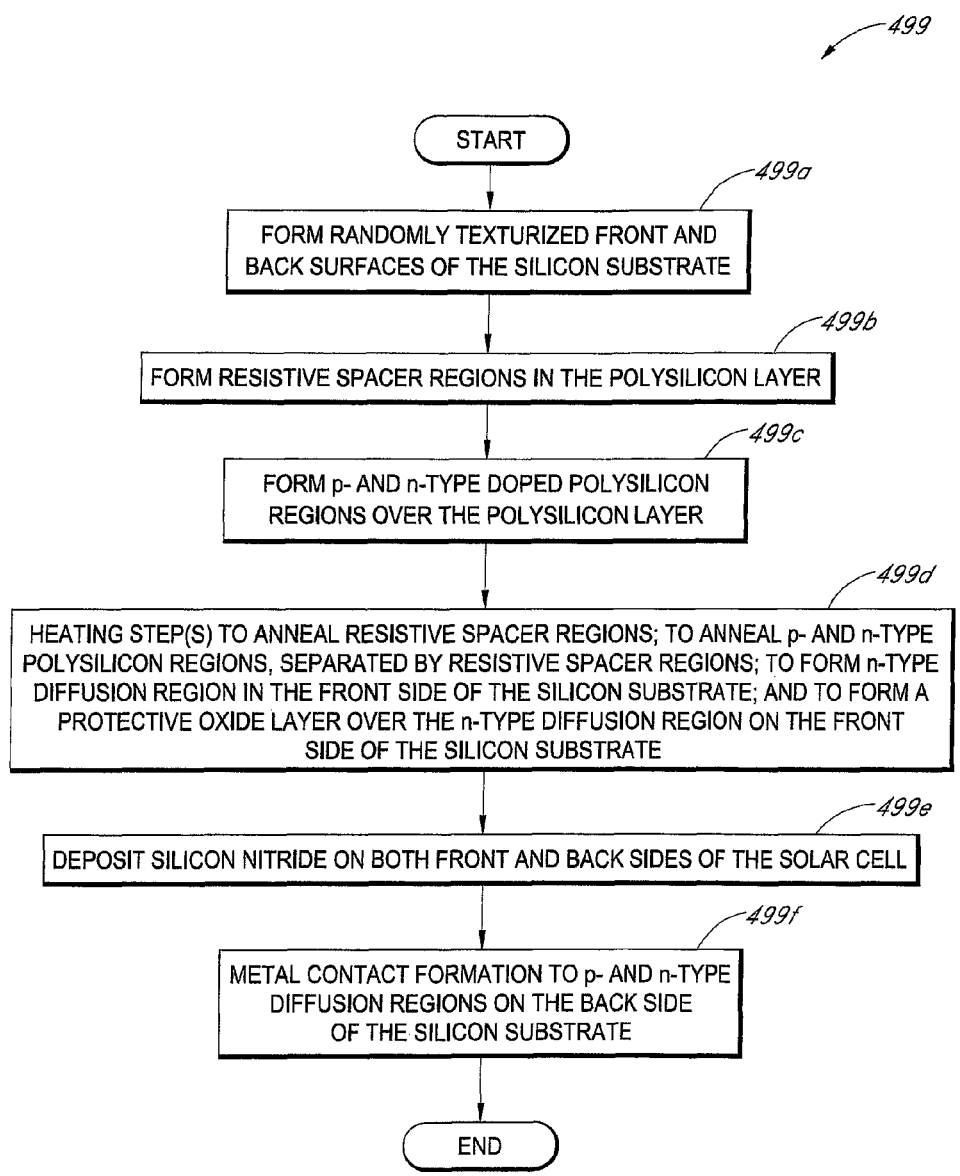
FIG. 34 is a flowchart illustrating a process for creating a solar cell with resistive spacer regions, in accordance with the embodiment shown in FIGS. 29-33.

FIG. 34 is a flowchart diagram 499 of a process for fabricating a solar cell in accordance with the embodiments described with respect to FIGS. 28-33. A silicon substrate, such as an n-type monocrystalline substrate, can be processed to create texturized front and back surfaces 499*a*. Resistive spacer regions can then be formed in the back surface of the silicon substrate 499*b*. Doped nanoparticle silicon can then be deposited on the back surface between the resistive spacer regions 499*c*. The doped nanoparticle silicon can be cured, coalesced, and annealed, with or without a capping layer, to form doped polysilicon regions on the back surface of the solar cell 499*d*. In some embodiments, a thin dielectric layer can be formed between the doped polysilicon regions and the substrate surface, including prior to nanoparticle deposition.

After creating electrically-active regions of doped polysilicon on the back surface of the silicon substrate, ARC and bARC layers can be formed on the front and back surfaces, respectively 499*e*. Contact openings can then be made through the bARC layer and interdigitated metal grids formed to electrically connect to the doped polysilicon regions 499*f*. Metallization can be performed using any desired technique or combination of processes.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A solar cell having a front side facing the sun during normal operation and a back side facing away from the sun, the solar cell comprising:
    a silicon substrate having a front side and a back side;
    a continuous polysilicon layer formed on the back side of the silicon substrate;
    a first doped polysilicon region and a second doped polysilicon region of opposite polarity and formed in the continuous polysilicon layer;
    a resistive region disposed between the first and second doped polysilicon regions in the continuous polysilicon layer, the resistive region comprising oxygen;
    a first metal grid disposed over the second doped polysilicon region, the first metal grid electrically connected to at least the second doped polysilicon region;
    a dielectric layer between the silicon substrate and the continuous polysilicon layer; and
    a second metal grid electrically connected to the first doped polysilicon region, wherein the first and second metal grids are formed on the back side of the solar cell.

2. The solar cell of claim 1, wherein the dielectric layer comprises silicon dioxide.

3. The solar cell of claim 1, wherein the resistive region has a randomly textured surface.

4. A solar cell having a front side facing the sun during normal operation and a back side facing away from the sun, the solar cell comprising:
    a silicon substrate having a front side and a back side;
    a continuous layer of polysilicon formed on the back side of the solar cell;
    a first doped region and a second doped region formed in the continuous layer of polysilicon and are of opposite polarity; and
    a resistive region disposed in the continuous layer of polysilicon between the first and second doped regions, the resistive region comprising oxygen.

5. The solar cell of claim 4, wherein the back side of the silicon substrate has a randomly textured surface.

6. The solar cell of claim 4, further comprising a dielectric layer between the continuous layer of polysilicon and the backside of the silicon substrate.

7. The solar cell of claim 6, wherein the dielectric layer comprises silicon dioxide.

* * * * *